United States Patent
Chan et al.

(10) Patent No.: US 9,837,142 B1
(45) Date of Patent: *Dec. 5, 2017

(54) AUTOMATED STRESSING AND TESTING OF SEMICONDUCTOR MEMORY CELLS

(71) Applicant: International Business Machines Corporation, Armonk, NY (US)

(72) Inventors: Yuen H. Chan, Poughkeepsie, NY (US); Michael B. Kugel, Boeblingen (DE); Stefan Payer, Stuttgart (DE); Wolfgang Penth, Holzgerlingen (DE); Juergen Pille, Stuttgart (DE); Tobias Werner, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/207,618

(22) Filed: Jul. 12, 2016

(51) Int. Cl.
*G11C 11/00* (2006.01)
*G11C 11/419* (2006.01)

(52) U.S. Cl.
CPC ................... *G11C 11/419* (2013.01)

(58) Field of Classification Search
CPC ...... G11C 29/12; G11C 11/418; G11C 11/419
USPC ..... 365/154, 185.18, 185.23, 129, 156, 174, 365/188, 189.011, 201, 200, 202, 203
See application file for complete search history.

(56) References Cited

U.S. PATENT DOCUMENTS

| | | | |
|---|---|---|---|
| 5,424,988 A | 6/1995 | McClure et al. | |
| 6,643,804 B1 * | 11/2003 | Aipperspach | G11C 29/12 365/201 |
| 7,133,320 B2 | 11/2006 | Adams et al. | |
| 7,805,645 B2 | 9/2010 | Frey et al. | |
| 8,064,279 B2 | 11/2011 | Houston et al. | |
| 8,379,467 B2 | 2/2013 | Deng et al. | |
| 8,593,890 B2 | 11/2013 | Adams et al. | |
| 9,064,071 B2 | 6/2015 | Bansal et al. | |
| 9,542,996 B2 * | 1/2017 | Thomas | G11C 11/419 |
| 9,558,805 B2 * | 1/2017 | Kang | G11C 11/40603 |
| 2010/0142300 A1 * | 6/2010 | Chen | G11C 29/50 365/201 |
| 2012/0075918 A1 | 3/2012 | Arsovski et al. | |

(Continued)

OTHER PUBLICATIONS

Ney et al., "A New Design-for-Test Technique for SRAM Core-Cell Stability Faults", Automation & Test in Europe Conference & Exhibition, Apr. 20-24, 2009, 5 pages.

(Continued)

*Primary Examiner* — Fernando Hidalgo
(74) *Attorney, Agent, or Firm* — Nicholas D. Bowman

(57) ABSTRACT

A memory cell readable through a bit line and addressable through a word line can be stressed by applying a stress voltage to the bit line for a stress voltage time, and addressing the memory cell through the word line for an addressing time included within the stress voltage time. The memory cell can be tested by writing a data value into the memory cell, stressing the memory cell, reading the stored value from the memory cell, and determining whether the stored value corresponds to the data value. A testable memory array can include a memory cell addressable through a word line and readable through a bit line, a precharge circuit, a stress circuit, and an array built-in self test (ABIST) circuit. The ABIST circuit can be configured to stress the memory cell by applying a stress signal to the stress circuit.

9 Claims, 5 Drawing Sheets

(56) References Cited

U.S. PATENT DOCUMENTS

| | | |
|---|---|---|
| 2013/0058177 A1 | 3/2013 | Seshadri et al. |
| 2016/0055921 A1 | 2/2016 | Jungmann et al. |
| 2016/0196871 A1* | 7/2016 | Liaw ..................... G11C 11/419 |
| | | 365/154 |
| 2017/0047113 A1* | 2/2017 | Kim ....................... G11C 11/565 |
| 2017/0053696 A1 | 2/2017 | Jeong et al. |

OTHER PUBLICATIONS

Park et al., "In Situ SRAM Static Stability Estimation in 65-nm CMOS", IEEE Journal of Solid-State Circuits, vol. 48, No. 10, Oct. 2013, pp. 2541-2549.
Mamy Randriamihaja et al., "Assessing Intrinsic and Extrinsic End-of-Life Risk Using Functional SRAM Wafer Level Testing", ResaerchGate, Article—Apr. 2015, 5 pages, ©2015 IEEE.
Kugel et al., "Stressing and Testing Semiconductor Memory Cells", U.S. Appl. No. 15/207,531, filed Jul. 12, 2016.
IBM, List of IBM Patents or Patent Applications Treated as Related, Jul. 11, 2016, 2 pages.
Chan et al., "Automated Stressing and Testing of Semiconductor Memory Cells", U.S. Appl. No. 15/414,667, filed Jan. 25, 2017.
IBM, List of IBM Patents or Patent Applications Treated as Related, Jan. 24, 2017, 2 pages.

\* cited by examiner

US 9,837,142 B1

AUTOMATED STRESSING AND TESTING OF SEMICONDUCTOR MEMORY CELLS

BACKGROUND

The present disclosure generally relates to memory architecture, and more specifically, to testing of memory cells in a semiconductor memory array.

As the design of semiconductor memory arrays advances over time, the number and density of memory cells in a memory array generally increases. As a result, the quality of the memory cells of a memory array may fluctuate. In particular, relatively weak memory cells can change their cell content data during a read operation. Memory array testing may be required to determine and/or monitor the quality of memory cells. In particular, read stability memory cells may be tested and/or monitored to ensure that it is at sufficient during the entire estimated lifetime of the memory array. Traditionally, a supplementary power supply, separate from a supply voltage $V_{DD}$, has been provided for resell testing. However, providing a supplementary power supply can caused increased difficulties in wire routing to the memory array and within a host integrated circuit (IC) in general.

SUMMARY

An improved memory array that allows read stability tests and methods for stressing and testing a memory cell can have certain advantages in increasing the reliability of semiconductor memory arrays.

Embodiments may be directed towards a method for stressing a semiconductor memory cell. The memory cell may be readable through a bit line and addressable through a word line. The method can include applying, to the bit line, a stress voltage for a stress voltage time. The method can also include addressing, through the word line, the memory cell for an addressing time, the addressing time being included within the stress voltage time.

Embodiments may also be directed towards a method for testing a semiconductor memory cell. The memory cell may be readable through a bit line and addressable through a word line. The method can also include writing a first data value into the memory cell and stressing the memory cell by applying, to the bit line, a stress voltage for a stress voltage time. The method can also include reading a first stored value from the memory cell and determining whether the first stored value corresponds to the first data value.

Embodiments may also be directed towards a memory array that includes at least one memory cell. The at least one memory cell can be addressable through a word line and readable through a bit line. The memory array can also include a precharge circuit, a stress circuit and an array built-in self test (ABIST), circuit. The ABIST circuit can be configured to stress the memory cell by providing a stress signal to the stress circuit.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
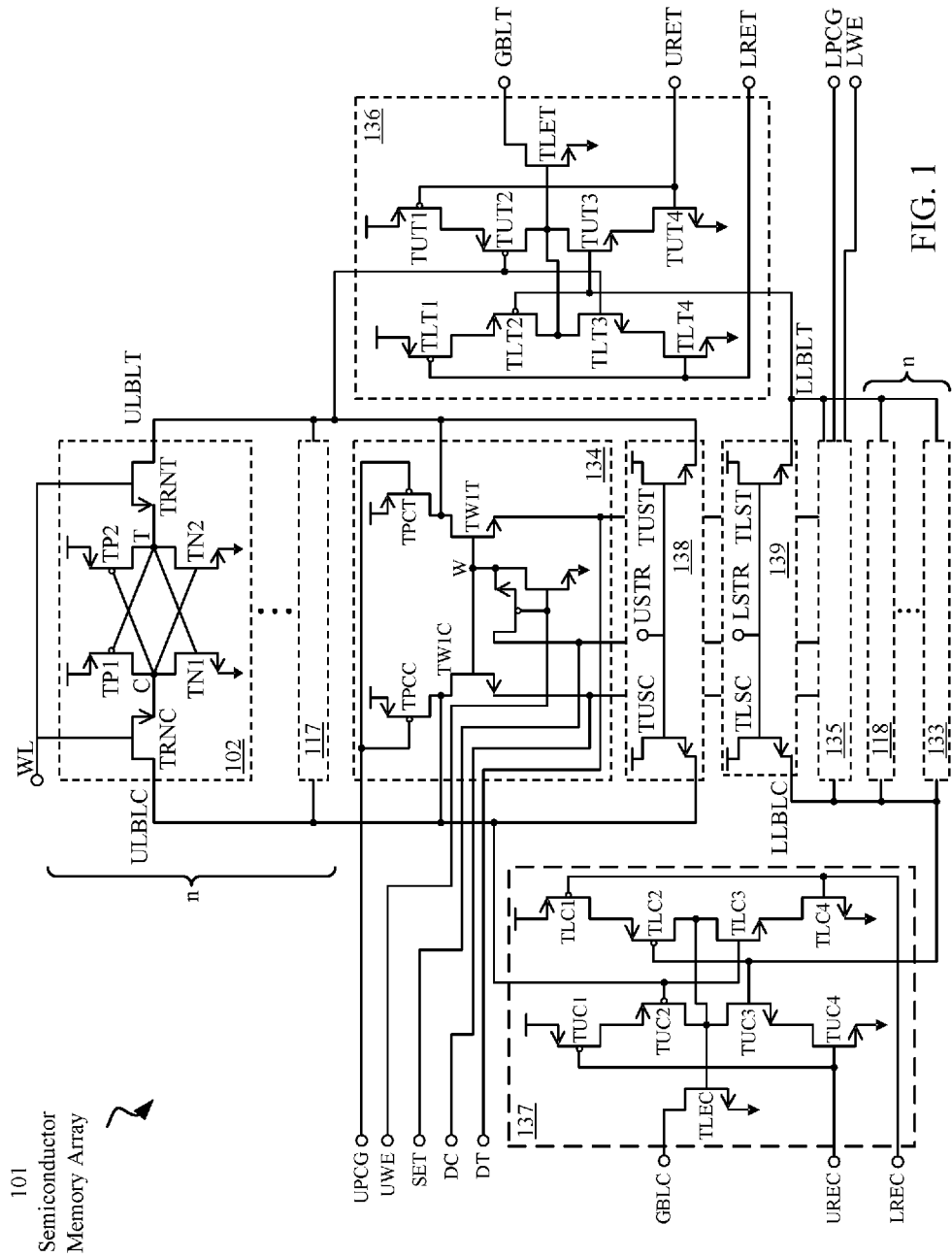
FIG. 1 depicts a semiconductor memory array.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

In the drawings and the Detailed Description, like numbers generally refer to like components, parts, steps, and processes.

DETAILED DESCRIPTION

The present disclosure may be better understood, and its numerous objects, features, and advantages made apparent to those skilled in the art by referencing the accompanying drawings.

FIG. 1 depicts a memory array 101 which allows for testing the read stability of the memory cells 102-117 and 118-133. The memory array 101 includes "n" memory cells 102-117 connected to a common upper local bit line ULBLT and a common complement upper local bit line ULBLC. Moreover, each of the memory cells 102-117 is connected to a respective word line WL for addressing the memory cell 102-117 to be read.

The memory array 101 further includes "n" memory cells 118-133 which are connected to a common lower local bit line LLBLT and to a common complement lower local bit line LLBLC. The memory cells 118-133 are addressable through respective word lines, not shown. In an example embodiment, the number "n" of memory cells 118-133 connected to a common, complement bit line may be sixteen.

Write circuits 134 and 135 may be used to write data or content into the respective memory cells 102-117 and 118-133. The content of the memory cells 102-117 and 118-133 may be evaluated using local evaluation circuits 136 and 137. In addition, stress may be applied to the memory cells 102-117 and 118-133 using stress circuits 138 and 139.

In the embodiment shown in FIG. 1, the memory array 101 is symmetrical with respect to the "true" side and the "complement" side, as well as symmetrical with respect to the upper and lower side. However, in some embodiments, the memory array 101 may also include only one local evaluation circuit 136 or 137 on either the true side or the complement side. Moreover, in some embodiments, the memory array 101 may include only an upper or a lower section. In embodiments, it is possible that only the true or complement side of the memory cells 102-117 and 118-133 may be used for writing content into, and reading the content from, the memory cells 102-117 and 118-133.

The write circuit 134 includes a precharge circuit including the transistors TPCC and TPCT, which are used for precharging the upper local bit line ULBLT and the complement upper local bit line ULBLC, in response to an upper precharge signal UPCG. In the embodiment shown in FIG. 1 the transistors TPCC and TPCT are P-channel field-effect transistors (PFETs).

Two transistors, the N-channel field-effect transistor (NFET) TWIT and the NFET TW1C, are used for writing data received at the data input DT and the complement data input DC into the memory cells 102-117, in response to a signal at the SET input.

The data input DT, the complement data input DC and the SET input are common to both the upper write circuit 134 and the lower write circuit 135. An upper write enable input UWE and a lower write enable input LWE allow for selecting if the data shall be written, in response to the set signal, into the upper memory cells 102-117, or into the lower memory cells 118-133.

The memory cells 102-117 and 118-133 may be read using the bit lines ULBLC, ULBLT, LLBLC and LLBLT. According to embodiments, the memory cell 102 is a static random-access memory (SRAM) memory cell, more specifically a 6-transistor static random-access memory (6T-SRAM) memory cell. The memory cell 102 includes four transistors TP1, TN1, TP2 and TN2 forming a latch and two transistors TRNC and TRNT used for writing and reading the content stored within the latch.

The latch may be in a state having a logical "low" potential at node T causing the transistor TP1 to be conductive and the transistor TN1 to be non-conductive or turned off. Accordingly, the latch has a logical high potential at node C causing the transistor TP2 to be non-conductive and the transistor TN2 to be conductive.

Before reading the content of the memory cell 102, the potential of the local bit lines ULBLC and ULBLT is raised to a logical "high" level. Afterwards, the memory cell 102 the transistors TRNC and TRNT are caused to be conductive in response to a signal on the word line WL.

In the embodiment shown in FIG. 1, the gates of the transistors TRNC and TRNT are connected to a common word line. However, in some embodiments, the transistors TRNC and TRNT, which allow addressing the memory cell 102, may be connected to separate word lines, for example, a regular word line WLT and a complement word line WLC. This connection scheme may allow for testing the reading circuit on both or on only one of the true or complement sides of the memory cell 102.

When transistor TN2 is conductive, the bit line ULBLT is pulled down to a logical low voltage. However, if the transistor TN1 is faster in pulling down node C in response to the logical high voltage of the local bit line ULBLT than transistor TN2 is in pulling down node T, the state of the latch may flip so that a logical high value or potential is present at node C.

Memory cells changing their content or data value during a read operation may be considered as defective, and may need to be avoided. Accordingly, the memory array 101 includes stress circuits 138 and 139 for testing the memory cells 102-117 and 118-133. The stress circuits 138 and 139 include transistors TUST, TUSC and TLST, TLSC, respectively, for providing additional electric charge to the local bit lines ULBLT, ULBLC, LLBLT and LLBLC in response to a stress signal USTR, LSTR applied to the gates of the transistors TUST and TUSC as well as TLST and TLSC, respectively.

In the embodiment shown in FIG. 1, the transistor pairs TUST, TUSC and TLST, TLSC are NFETs. Accordingly, the voltage applied to the local bit lines ULBLT, ULBLC, LLBLT and LLBLC is reduced by the threshold voltage $V_T$ of the transistors TUST, TUSC, TLST and TLSC. Thus, the voltage $V_{DD}-V_T$ is applied to the local bit lines ULBLT, ULBLC, LLBLT and LLBLC. This may be referred to as a "weak flood" of the local bit lines ULBLT, ULBLC, LLBLT and LLBLC.

In some embodiments, not shown, the transistor pairs TUST, TUSC and TLST, TLSC may be PFETs. Thus, the stress signal USTR, LSTR applied to the gates of the transistors TUST and TUSC as well as TLST and TLSC, respectively, will be inverted. Moreover, the conductive PFETs will apply the full voltage $V_{DD}$ to the local bit lines ULBLT, ULBLC, LLBLT and LLBLC. This may be referred to as a "strong flood" of the local bit lines ULBLT, ULBLC, LLBLT and LLBLC.

The local bit lines ULBLT and LLBLC may be read using the local evaluation circuit 136. The local evaluation circuit 136 may read only the local bit line ULBLT or only the local bit line LLBLT, or both local bit lines ULBLT and LLBLT, in response to input signals URET and LRET.

The local evaluation circuit 136 includes a pull-down transistor TLET for pulling down the global bit line GBLT to ground in case one of the activated local bit line(s) ULBLT, LLBLT is at ground.

A logical low voltage on the input signal URET activates the local bit line ULBLT. The transistor TUT1 becomes conductive and the transistor TUT4 becomes non-conductive. A logical low voltage on the local bit line ULBLT causes transistor TUT2 to be conductive and transistor TLT3 to be non-conductive. Hence, $V_{DD}$ is applied to the gate of transistor TLET through conductive transistors TUT1 and TUT2. Accordingly, the transistor TLET will pull the global bit line GBLT to ground, irrespective of the voltage of the local bit line LLBLT.

A logical low voltage of the input signal LRET activates the local bit line LLBLT. The transistor TLT1 becomes conductive and the transistor TLT4 becomes non-conductive. A logical low voltage on the local bit line LLBLT causes transistor TLT2 to be conductive and transistor TLT3 to be non-conductive. Hence, $V_{DD}$ is applied to the gate of transistor TLET through conductive transistors TLT1 and TLT2. Accordingly, the transistor TLET will pull the global bit line GBLT to ground, irrespective of the voltage of the local bit line ULBLT. The local evaluation circuit 137 functions in a similar fashion.

Array built-in self test (ABIST) circuits have become popular for use with on-chip testing of memory arrays. Generally, ABIST circuits may determine defective memory cells including dysfunctional wiring. Inputs of the memory may be automatically connected to redundant, functional, memory cells instead of being connected to defective cells. Using an ABIST circuit for providing the stress signal to the stress circuit may allow for regularly testing of the memory cells also for stress resistance, which can result in enhanced reliability of memory cells within semiconductor memory arrays.

In some embodiments of the memory array, the ABIST circuit can include a write protect circuit configured to override, during a read operation. The write protect circuit may prevent stress from being applied to the bit line while data is written into the memory cells.

In some embodiments, the ABIST circuit can include an alternative control input. The alternative control input may allow a stress signal to be applied independently of a stress pattern generated by the ABIST circuit. The alternative control input may be used by external testing equipment, which tests the memory array after fabrication.

In embodiments, the source of the stress transistor can be connected to $V_{DD}$, and the drain of the stress transistor is connected to the bit line. In embodiments, the source of the stress transistor can be connected to $V_{DD}$, and the drain of the stress transistor is connected to the bit line. In some embodiments, the stress transistor can be an NFET, which may allow for a relatively weak stress to be applied to the bit line. In some embodiments the stress transistor can be a PFET, which may allow for a relatively strong stress is to be applied to the bit line. In some embodiments, the gate of the stress transistor is driven by a programmable clock generator, which may be self-resetting. In some embodiments, the memory cell is a 6-transistor SRAM (6T-SRAM) cell, which can include fin field-effect transistor (FINFET) transistors. In some embodiments of the memory array, the memory cell is an 8-transistor SRAM (8T-SRAM) cell, which can also include FINFET transistors.

Figure 2:
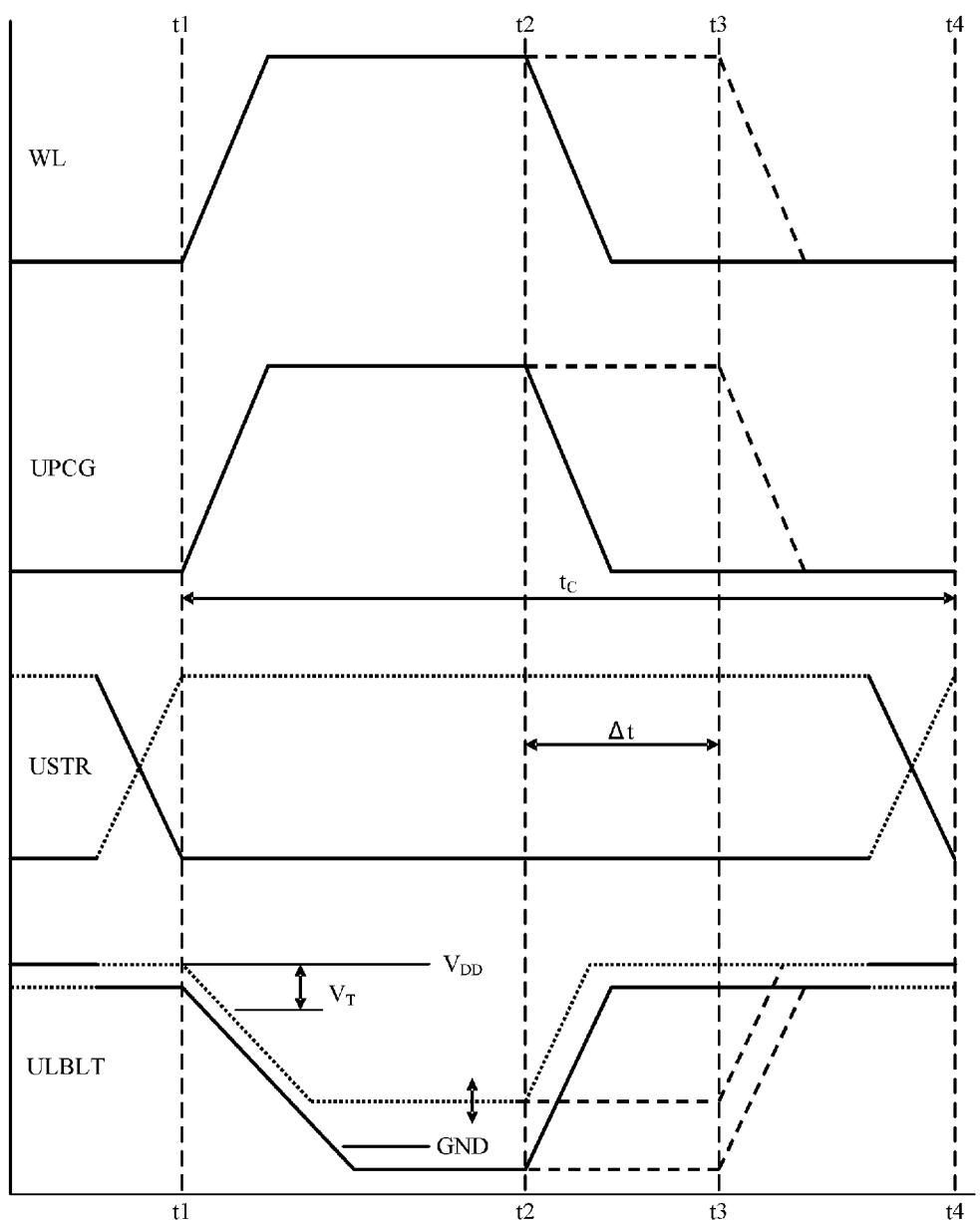
FIG. 2 depicts example memory array signals over time used in a method for applying stress to memory cells of a memory array using a full stress scheme.

FIG. 2 depicts waveforms and an associated method for applying stress to memory cells of a memory array using a full stress scheme. The waveform diagram shows, in simplified form, the voltages of the word line WL, the precharge signal UPCG, the stress signal USTR and the local bit line ULBLT, over time. The continuous, solid lines depict a normal functional read operation and the dashed lines depict a full stress functional read operation. As shown with dashed lines, the stress signal USTR transitions from a logical low level to a logical high level before the precharging of the local bit line ULBLT is terminated by raising the precharging signal UPCG to a logical high level and before addressing of the memory cells 102-117 is started by raising the word line WL from a logical low level to a logical high level. The dashed line stress signal USTR remains at a logical high level at least for the time the word line WL and the precharge signal UPCG are at a logical high level.

While the word line WL is high, the memory cells 102-117 storing a logical low level at the node T try to pull the local bit line ULBLT to ground. Simultaneously, the transistor TUST becomes conductive and tries to pull the local bit line ULBLT to $V_{DD}-V_T$. Depending on the relative device strengths of the transistors of the memory cells 102-117 and the transistor TUST, the local bit line ULBLT will thus assume a value between ground and $V_{DD}-V_T$, as indicated with the vertical double arrow. Therefore, the memory cells 102-117 are stressed for the duration the word line WL is at a logical high level. This period may be enlarged by a time Δt as indicated with dashed lines.

For normal functional reading of the memory cells 102-117, the stress signal USTR, shown with continuous, solid lines, is pulled to ground before the precharge signal USTR and the word line WL both transition to a logical high level. The memory cells 102-117, addressed by the word line WL and storing a logical low level at the node T, will slowly pull the local bit line ULBLT to ground. At time t2, the addressing of the memory cells 102-117 stops by pulling the word line WL to ground. The precharge signal UPCG being pulled to ground again will cause the transistor TPCT to become conductive again and raise the local bit line ULBLT to $V_{DD}$. The stress signal USTR transitions to a logical high level again, only after the word line WL and the precharge signal UPCG have been pulled to a logical low level.

As indicated in FIG. 2, the stress signal USTR may be inverted, corresponding to the clock cycle tc, which may be considered to start at time t1 and to end at time t4. During a first clock cycle the memory cells 102-117 connected to the local bit line ULBLT may be stressed, and during a subsequent clock cycle the memory cells 102-117 may be functionally read. In this manner, it may be determined if applying stress according to a full stress scheme may "flip" or invert the content of the memory cells 102-117 directly in the subsequent clock cycle.

Moreover, the method for testing the memory cells according to the full stress scheme may be carried out at any frequency, as desired. The clock cycle time may range between an extended time to the cycle time corresponding to the maximum memory design frequency. The above-described full stress scheme may allow for turning on/off the stress on a cycle by cycle basis.

The method described above can include applying a stress voltage to the bit line for a stress voltage time, and addressing the memory cell through the word line for an addressing time, where the addressing time is included within the stress voltage time. Applying the stress voltage during the entire time the word line is active may be considered as "flood mode" stress. The flood mode stress may stress the memory cells in a manner comparable to traditional stress techniques without requiring an additional power supply. Reduced in simplified wiring for memory arrays may result from the use of this technique.

In some embodiments, the addressing time is longer than the time required for discharging the bit line through the memory cell. In case of normal functional reading, the addressing time is long enough to allow for almost complete discharging of the bit line. Selecting essentially the same addressing time also during the method for stressing the memory cell may result in a behavior of the memory cells which is comparable to the behavior of the memory cells during functional reading at the end of their expected lifetime.

In some embodiments, the stress voltage is $V_{DD}$. Applying a stress voltage of $V_{DD}$ may be considered as a "strong" stress. Hence, only robust memory cells may resist "flipping" or inverting the contents stored within them, and therefore pass the test. In some embodiments, the stress voltage is $V_{DD}-V_T$. Applying a stress voltage of $V_{DD}-V_T$, i.e. a voltage of $V_{DD}$ reduced by the threshold voltage $V_T$ of an N-channel field-effect transistor (NFET) transistor may be considered as a "weak" stress. Therefore, an increased number of memory cells may pass the test relative to the number of memory cells passing a test involving a "strong" stress. This type of testing can enhance the yield of the tested memory cells, while providing a sufficient safety margin for end of life degradation.

Figure 3:
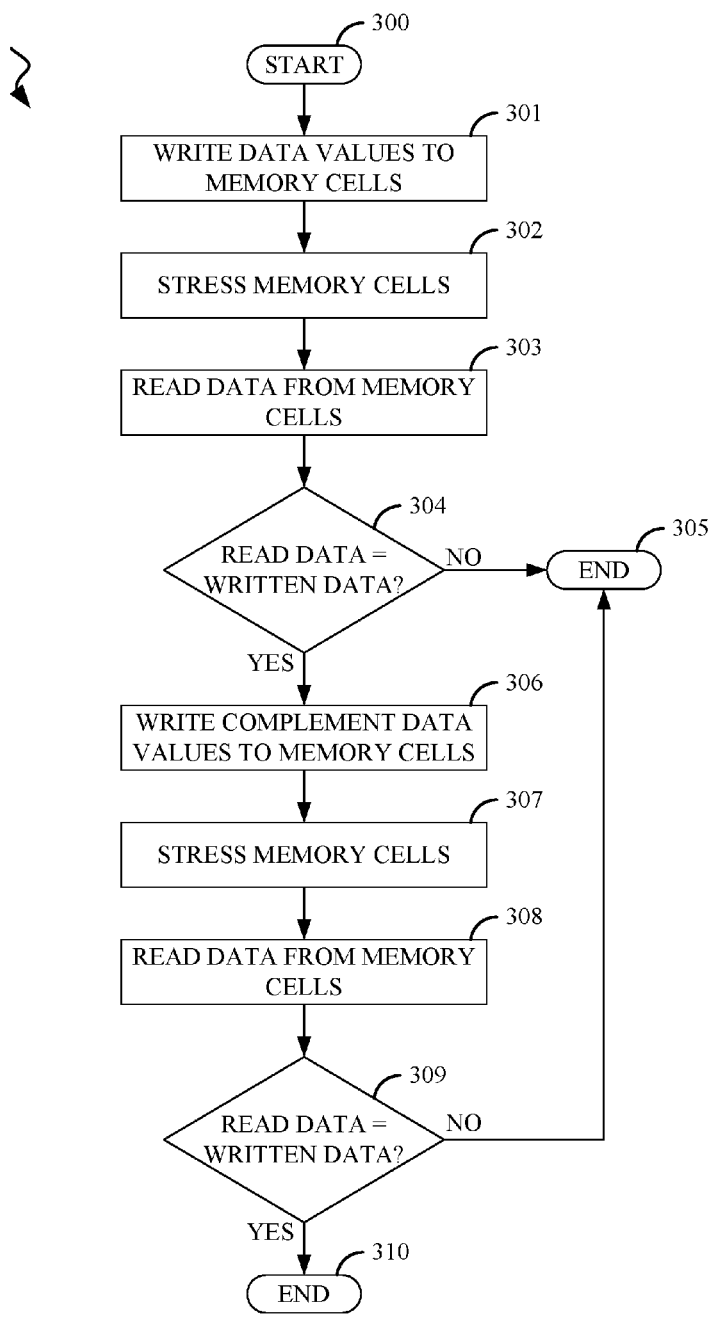
FIG. 3 is a flow diagram illustrating a method for testing memory cells of a memory array.

FIG. 3 illustrates a method for testing memory cells of a memory array. The process moves from start 300 to operation 301. In operation 301, the same defined data value is written to all memory cells 102-117 and 118-133 (FIG. 1), to be tested. For example, the memory cells 102-117 and 118-133 (FIG. 1) may be written to have a logical "low" voltage at node T.

In a second operation 302, a stress voltage is applied to the memory cells 102-117 and 118-113 (FIG. 1) according to a pulse stress scheme and/or a full stress scheme described above. Then, in operation 303, a functional read operation is performed on the memory cells 102-117 and 118-133 (FIG. 1). In operation 304 it is determined if the result of the functional read operation corresponds to the logical data value represented by the voltage, which has been written to node T. If the values are different, a weak memory cell has been found and testing may stop in operation 305. If the values correspond to each other, the complement or inverted value is written to all memory cells 102-117 and 118-133 (FIG. 1) in operation 306. For example, if in operation 301, the memory cells 102-117 and 118-133 (FIG. 1) have been written to have a logical low voltage at node T, the memory cells 102-117 and 118-133 (FIG. 1) are written to have a logical high voltage at node T. The same stress is applied to the memory cells 102-117 and 118-133 (FIG. 1) in operation 307 as in operation 303. In operation 308, all memory cells 102-117 and 118-133 (FIG. 1) are read again. In operation 309, the read value is compared with the inverted value written in operation 306. If the values are different, a weak memory cell has been found and testing stops at operation 305. If the values are the same, it is determined that all memory cells are good and the method stops at operation 310.

In some embodiments, the method for testing memory cells of a memory array can also include writing a second data value into the memory cell, where the second data value corresponds to the complement of the first data value, stressing the memory cell according to the method described above, reading the stored value from the memory cell and determining whether the stored value corresponds to the second data value. By stressing the memory cell for read stability for both possible states of the memory cell, due account may be taken for the symmetry of the memory cell.

In some embodiments, stressing the memory cell and reading the memory cell are performed in different cycles. Performing stressing and reading in different cycles may enhance the reliability of the test, because interferences between stressing and reading may be reduced. In some embodiments, stressing the memory cell can be performed in one memory cycle and reading the memory cell is performed in a subsequent memory cycle. This technique may allow for the stress signal to be switched from "stress" to "no-stress" after each memory cycle. This technique may facilitate control of the stress signal.

Figure 4:
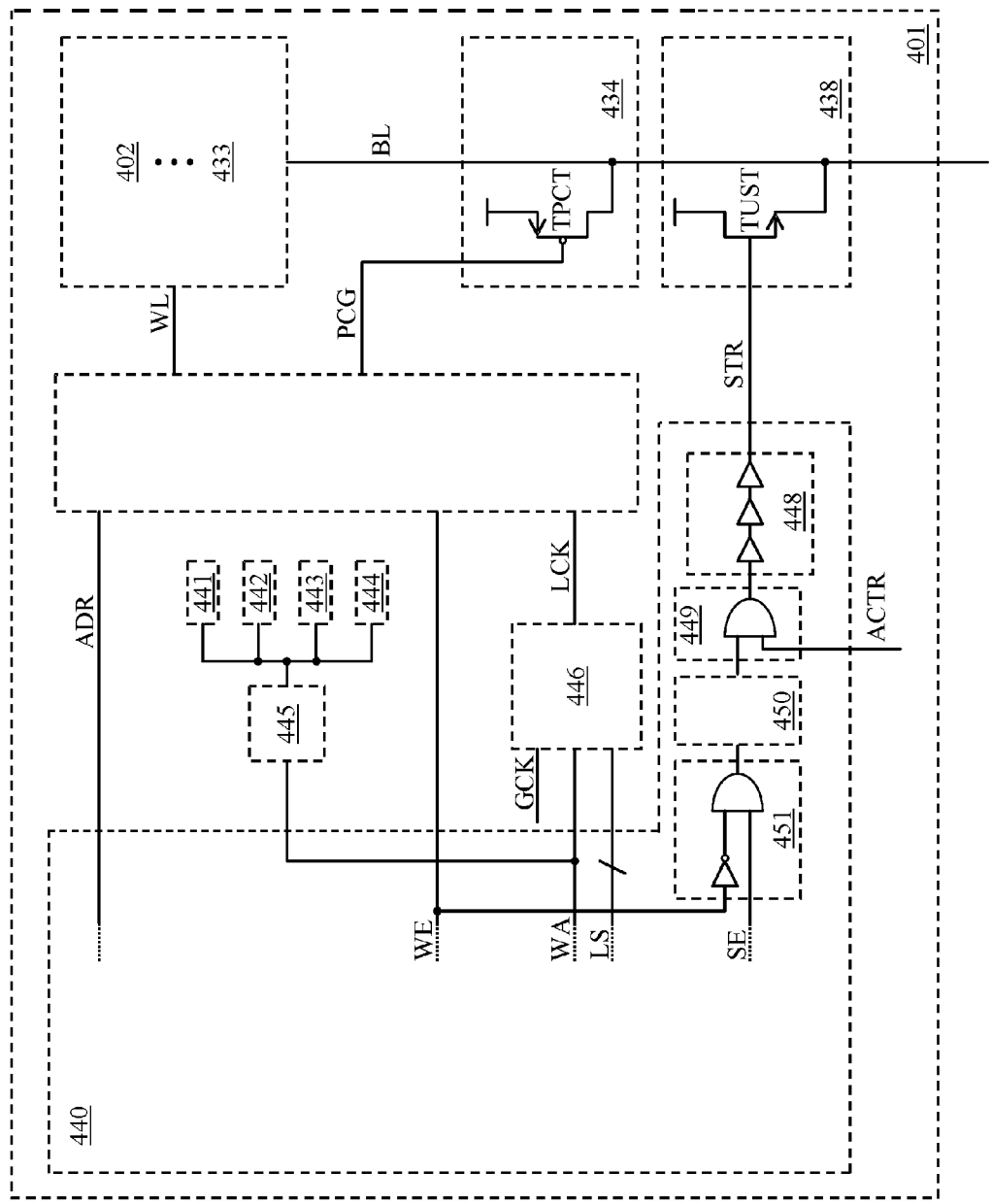
FIG. 4 depicts a memory array in a simplified form.

FIG. 4 depicts a memory array 401 in a simplified form. The memory array 401 includes memory cells 402-433 which may be addressed through word lines WL and read through bit line(s) BL. Furthermore, a write circuit 434 including a precharge circuit is provided which allows precharging bit line(s) BL. Moreover, the memory array 401 includes a stress circuit 438 configured to apply a stress voltage to the bit line(s) BL, in response to a stress signal STR. An ABIST circuit 440 can be used to generate the stress signal.

The ABIST circuit 440 is configured to perform tests on the memory cells 402-433 using various patterns, which may be stored in registers 441-444, and which may be assessed by access circuitry 445, in response to a word active signal WA. The ABIST circuit 440 may provide a signal ADR indicating which memory cells 402-433 of the memory array are to be addressed for writing, reading or stressing. Further, the ABIST circuit 440 provides a write enable signal WE indicating that content is to be written to the memory cells 402-433 as indicated by the signal ADR.

A local clock generator 446 generates a local clock signal in response to a global clock signal, particularly in response to a rising or falling edge of the global clock signal, and a word active signal WA. The pulse width of the local clock signal may be independent of the global clock signal. The pulse width of the local clock signal may determine the pulse width of the word line signal. Different parameters LS concerning the timing of the local clock signal, e.g., offset, pulse width and edge steepness, may be provided to the local clock generator 446 by the ABIST circuit 440.

An address converter 447 can receive and convert the signal ADR to activate the word line(s) of the addressed memory cells 402-433 and to provide the precharge signal to the corresponding bit line(s).

A test pattern in the ABIST circuit 440 may result in stress being applied to the memory cells 402-433 and a stress enable signal SE being provided as an input to a write protect circuit 451. The other input of the write protect circuit 451 is connected to the write enable signal WE. Accordingly, the write protect circuit 451 only stores a value indicating that stress is to be applied in the pipeline latch 450 in case the write enable signal WE is not active. The pipeline latch 450 can allow for an input setup timing reduction. An AND-gate 449 is provided at the output of the pipeline latch 450 to allow for an alternative control of the stress signal through an alternative control input ACTR. The output of the AND-gate 449 is connected to a buffer 448 before being transmitted to the stress circuit 438.

Figure 5:
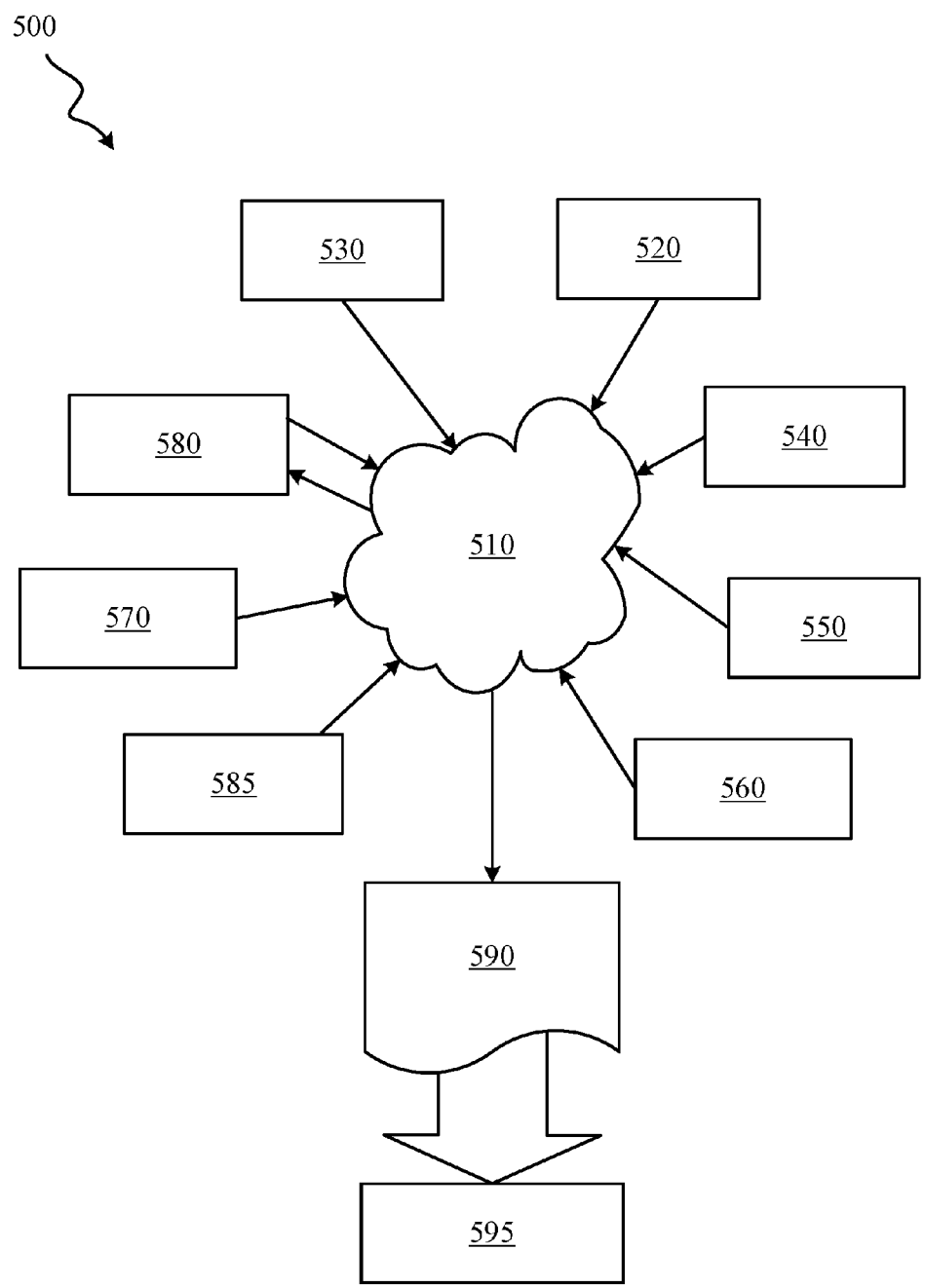
FIG. 5 is a diagram depicting a design process used in semiconductor design, manufacture, and/or test of the inventive memory array depicted in, according to embodiments of the disclosure.

FIG. 5 depicts multiple design structures 500 including an input design structure 520 that is preferably processed by a design process. Design structure 520 may be a logical simulation design structure generated and processed by design process 510 to produce a logically equivalent functional representation of a hardware device. Design structure 520 may alternatively include data or program instructions that, when processed by design process 510, generate a functional representation of the physical structure of a hardware device. Whether representing functional or structural design features, design structure 520 may be generated using electronic computer-aided design, such as that implemented by a core developer/designer. When encoded on a machine-readable data transmission, gate array, or storage medium, design structure 520 may be accessed and processed by at least one hardware or software modules within design process 510 to simulate or otherwise functionally represent an electronic component, circuit, electronic or logic module, apparatus, device, or system such as those shown in FIG. 1, FIG. 4, or a circuit configured for carrying out the methods described in reference to FIG. 2 and FIG. 3. As such, design structure 520 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 510 preferably employs and incorporates hardware or software modules for synthesizing, translating, or otherwise processing a design/simulation functional equivalent of the components, circuits, devices, or logic structures shown in FIG. 1, FIG. 4, or a circuit configured for carrying out the methods described in reference to FIG. 2 and FIG. 3., to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describe the connections to other elements and circuits in an integrated circuit design. Netlist 580 may be synthesized using an iterative process in which Netlist 580 is resynthesized at least one times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510, without deviating from the scope and spirit of the disclosure. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures, along with any additional mechanical design or data, to generate a second design structure 590. Design structure 590 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 520, design structure 590 preferably comprises at least one files, data structures, or other computer-encoded data or instructions that reside on transmission or data storage media and that, when processed by an ECAD system, generate a logically or otherwise functionally equivalent form of at least one of the embodiments of the disclosure shown in FIG. 1, FIG. 4, or a circuit configured for carrying out the methods described in reference to FIG. 2 and FIG. 3. In one embodiment, design structure 590 may comprise a compiled, executable HDL simulation model that functionally simulates the devices shown in FIG. 1, FIG. 4, or a circuit configured for carrying out the methods described in reference to FIG. 2 and FIG. 3.

Design structure 590 may also employ a data format used for the exchange of layout data of integrated circuits and/or symbolic data format (e.g., information stored in a GDSII, GL1, OASIS, map files, or any other suitable format for storing such design data structures). Design structure 590 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1, FIG. 4, or a circuit configured for carrying out the methods described in reference to FIG. 2 and FIG. 3. Design structure 590 may then proceed to a state 595 where, for example, design structure 590 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A memory array comprising:
   at least one memory cell, the at least one memory cell being addressable through a word line and readable through a bit line;
   a precharge circuit;
   a stress circuit; and
   an array built-in self test (ABIST), circuit, the ABIST circuit being configured to stress the memory cell by providing a stress signal to the stress circuit, the ABIST circuit including a write protect circuit configured to override, during a read operation, a stress enable signal.

2. The memory array of claim 1, wherein the ABIST circuit includes an alternative control input.

3. The memory array of claim 1, wherein the stress circuit includes a stress transistor configured to apply, in response to the stress signal, a stress voltage to the bit line.

4. The memory array of claim 3, wherein the source of the stress transistor is connected to a supply voltage $V_{DD}$ and the drain of the stress transistor is connected to the bit line.

5. The memory array of claim 4, wherein the stress transistor is an N-channel field-effect transistor (NFET).

6. The memory array of claim 4, wherein the stress transistor is a P-channel field-effect transistor (PFET).

7. The memory array of claim 2, wherein the memory cell is a 6-transistor static random-access memory (6T-SRAM) cell.

8. The memory array of claim 7, wherein the 6T-SRAM cell comprises fin field-effect transistor (FINFET) transistors.

9. The memory array of claim 2, wherein the memory cell is an 8-transistor static random-access memory (8T-SRAM) cell.

* * * * *